(12) United States Patent
Krummacher et al.

(10) Patent No.: US 9,655,198 B2
(45) Date of Patent: May 16, 2017

(54) METHOD OF OPERATING AN ORGANIC LIGHT-EMITTING COMPONENT

(71) Applicant: OSRAM OLED GmbH, Regensburg (DE)

(72) Inventors: Benjamin C. Krummacher, Regensburg (DE); Erwin Lang, Regensburg (DE); Ulrich Niedermeier, Leiblfing (DE); Thorsten Vehoff, Regensburg (DE)

(73) Assignee: OSRAM Oled GmbH (DE)

( * ) Notice: Subject to any disclaimer, the term of this patent is extended or adjusted under 35 U.S.C. 154(b) by 9 days.

(21) Appl. No.: 14/905,316

(22) PCT Filed: Jul. 15, 2014

(86) PCT No.: PCT/EP2014/065152
§ 371 (c)(1),
(2) Date: Jan. 15, 2016

(87) PCT Pub. No.: WO2015/007733
PCT Pub. Date: Jan. 22, 2015

(65) Prior Publication Data
US 2016/0150619 A1     May 26, 2016

(30) Foreign Application Priority Data

Jul. 16, 2013   (DE) .................. 10 2013 107 529

(51) Int. Cl.
*H05B 33/08*     (2006.01)
*H01L 51/52*     (2006.01)
(Continued)

(52) U.S. Cl.
CPC ..... *H05B 33/0896* (2013.01); *H01L 51/0031* (2013.01); *H01L 51/5203* (2013.01); *H01L 51/504* (2013.01); *H01L 2251/5361* (2013.01)

(58) Field of Classification Search
None
See application file for complete search history.

(56) References Cited

U.S. PATENT DOCUMENTS

| | | |
|---|---|---|
| 2009/0189532 A1 | 7/2009 | Preuss |
| 2010/0084635 A1 | 4/2010 | Prat et al. |
| | (Continued) | |

FOREIGN PATENT DOCUMENTS

| | | |
|---|---|---|
| CN | 102668164 A | 9/2012 |
| WO | 2010/066245 A1 | 6/2010 |
| WO | 2012/052886 A2 | 4/2012 |

OTHER PUBLICATIONS

English translation of a Chinese Search Report dated Aug. 19, 2016 of corresponding Chinese Application No. 201480040780.0.

*Primary Examiner* — Jany Richardson
(74) *Attorney, Agent, or Firm* — DLA Piper LLP (US)

(57) ABSTRACT

A method of operating an organic light-emitting component having first and second electrodes that have arranged between them an organic functional layer stack having at least one organic light-emitting layer that, during operation, produces light emitted via a luminous area, the first and second electrodes and the organic functional layer stack are in an extensive form, in contact with the first electrode, at each of two opposite edges of the first electrode a respective conductor track is arranged that extends in a longitudinal direction along the respective edge, the two conductor tracks have contact made with them on a same side of the first electrode by a connection element so that during operation there is a voltage drop in each conductor track in the longitudinal direction, which voltage drop brings about a luminous density gradient on the luminous area in a direction following the longitudinal direction.

21 Claims, 7 Drawing Sheets

(51) Int. Cl.
 *H01L 51/00* (2006.01)
 *H01L 51/50* (2006.01)

(56) References Cited

U.S. PATENT DOCUMENTS

| | | |
|---|---|---|
| 2010/0244749 A1 | 9/2010 | Okawa et al. |
| 2010/0299978 A1* | 12/2010 | Werners ............ B32B 17/10174 40/204 |
| 2011/0049730 A1 | 3/2011 | Schmid et al. |
| 2011/0114992 A1 | 5/2011 | Schmid et al. |
| 2011/0121354 A1 | 5/2011 | Schmid et al. |

* cited by examiner

METHOD OF OPERATING AN ORGANIC LIGHT-EMITTING COMPONENT

TECHNICAL FIELD

This disclosure relates to a method of operating an organic light-emitting component.

BACKGROUND

Current methods involve operation of an organic light-emitting component so that the component emits light via a luminous area, which light varies over the luminous area. In particular, those methods can involve the light being emitted from the luminous area with a luminous density distribution that have a luminous density gradient.

For lighting purposes, for example, it may be desirable to use, rather than a conventional static light source that emits light with a luminous density distribution that does not vary in space and over time, a light source having a luminous density gradient and/or a color gradient. In addition, it may be desirable to vary the gradient over time and/or in space. It could therefore be helpful to provide a method of operating an organic light-emitting component involving production of a variation in an emitted light from an organic light-emitting component over time and/or in space.

SUMMARY

We provide a method of operating an organic light-emitting component, wherein the organic light-emitting component has a first electrode and a second electrode that have arranged between them an organic functional layer stack having at least one organic light-emitting layer that, during operation, produces light emitted via a luminous area, the first and second electrodes and the organic functional layer stack are in an extension form, in contact with the first electrode, at each of two opposite edges of the first electrode a respective conductor track is arranged that extends in a longitudinal direction along the respective edge, the two conductor tracks have contact made with them on a same side of the first electrode by a connection element so that during operation there is a voltage drop in each conductor track in the longitudinal direction, which voltage drop brings about a luminous density gradient on the luminous area in a direction following the longitudinal direction, the organic light-emitting component has a characteristic $r=dV/dj$, where V denotes an operating voltage and j denotes an operating current density and $dV/dj$ is the mathematical derivative of the operating voltage with respect to the operating current density, an operating point $r=r_A$ is chosen such that it holds that: $0.75 \leq U \leq 1$, with $U=1-(1-H)/(1+H)$, $H=\cos h^{-1}(L/\Lambda)$ and $\Lambda=(r/R)^{0.5}$, where d denotes a distance between the conductor tracks in a direction transverse to the longitudinal direction, $L=0.5 \times d$ and R is the sheet resistance of the first electrode.

We also provide a method of operating an organic light-emitting component, wherein the organic light-emitting component has a first electrode and a second electrode that have arranged between them an organic functional layer stack having at least one organic light-emitting layer that, during operation, emits light via a luminous area, wherein the first and second electrodes and the organic functional layer stack are in extensive form, the first electrode has contact made with it by at least one first connection element at an edge of the first electrode so that there is a voltage drop in the first electrode in a direction leading away from the at least one first connection element, which voltage drop brings about a luminous density gradient on the luminous area in the direction leading away from the at least one first connection element, the organic light-emitting component has a characteristic $r=dV/dj$, where V denotes an operating voltage and j denotes an operating current density, and $dV/dj$ is the mathematical derivative of the operating voltage with respect to the operating current density, an operating point $r=r_A$ is chosen such that it holds that: $U \leq 0.2$, with $U=1-(1-H)/(1+H)$, $H=\cos h^{-1}(L/\Lambda)$ and $\Lambda=(r/R)^{0.5}$, where d denotes a width of the luminous area transversely to the edge of the first electrode having the at least one connection element, $L=d$ and R is the sheet resistance of the first electrode.

DETAILED DESCRIPTION

Figure 1:
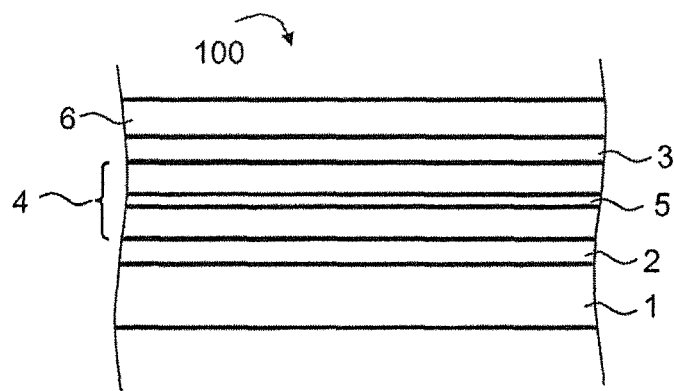
FIG. 1 shows a schematic illustration of an organic light-emitting component according to an example.

Our method of operating an organic light-emitting component may involve providing an organic light-emitting component having a first electrode and a second electrode that have arranged between them an organic functional layer stack having at least one organic light-emitting layer.

The organic light-emitting component may additionally have a substrate on which the first electrode and the second electrode are arranged. With the organic functional layer stack arranged between the electrodes, the electrodes and the substrate form a functional layer stack. At this juncture and subsequently, the "organic functional layer stack" denotes all of the organic layers of the organic light-emitting component that are arranged between the electrodes, while the "functional layer stack" has, in addition to the organic functional layer stack, at least also the electrodes and the substrate. The organic light-emitting component may particularly be in the form of an organic light-emitting diode (OLED) having at least one electroluminescent layer as at least one organic light-emitting layer.

The organic functional layer stack can have layers having organic polymers, organic oligomers, organic monomers, organic small, nonpolymeric molecules ("small molecules") or combinations thereof. In particular, it may be advantageous if the organic functional layer stack has one or more organic functional layers as hole transport layers to allow effective hole injection into the at least one light-emitting layer. By way of example, tertiary amines, carbazole derivatives, conductive polyaniline or polyethylenedioxythiophene can prove advantageous as materials for a hole transport layer. Suitable materials for the at least one organic light-emitting layer are materials that have radiation emission on the basis of fluorescence or phosphorescence, for example, polyfluorene, polythiophene or polyphenylene or derivatives, compounds, mixtures or copolymers thereof. In addition, the organic functional layer stack can have one or more functional layers that are in the form of electron transport layers. Furthermore, the layer stack can also have electron and/or hole blocking layers. The organic functional layer stack can also have a plurality of organic light-emitting layers that are arranged between the electrodes and that preferably emit light of different color.

In respect of the basic design of an organic light-emitting component, in this case in respect of the structure, the layer composition and the materials of the organic functional layer stack, for example, reference is made to WO 2010/066245 A1, which is expressly incorporated herein by reference, particularly with regard to the design, the layer composition and the materials of an organic light-emitting component.

The electrodes and the organic functional layer stack are each in extensive form. As a result, the organic light-emitting component has a contiguous luminous area not structured into functional subregions. In particular, the luminous area is not a luminous area segmented into functional regions or a luminous area formed by a multiplicity of image points, that is to say what are known as pixels. This allows extensive emission of the light produced in the organic light-emitting layer. In this case, "extensive" can mean that the organic light-emitting component and particularly the organic light-emitting layer has an area, particularly preferably a contiguous area, of greater than or equal to a few square millimeters, preferably greater than or equal to one square centimeter and particularly preferably greater than or equal to one square decimeter.

Particularly preferably, the organic light-emitting component can have just a single contiguous luminous area prompted by the extensive and contiguous form of the electrodes and of the organic functional layer stack.

Each of two opposite edges of the first electrode may have a conductor track arranged on it extending in a longitudinal direction along the respective edge, in contact with the first electrode. At this juncture and below, "longitudinal direction" denotes a direction that runs along the profile of the edges at which the conductor tracks are arranged. At this juncture and below, a direction transversely to the longitudinal direction denotes a direction running preferably perpendicular or at least essentially perpendicular to the direction of extent of the edges at which the conductor tracks are arranged and parallel to the main plane of extent of the first electrode. If the edges having the conductor tracks run not along a straight line, but rather along curved lines, then the terms longitudinal direction and transverse direction are intended to be understood in accordance with the curved profile. In addition, the conductor tracks each have a width that is less than their length along the respective edge. Hence, each of the conductor tracks has two longitudinal sides running along the edge profile of the first electrode, and also narrow or transverse sides connecting the longitudinal sides. Particularly preferably, each of the two conductor tracks can extend along the entire respective edge in the longitudinal direction over an edge region of the first electrode. In addition, each of the two conductor tracks can preferably have a greater extent in the longitudinal direction than in a direction transverse thereto.

Since the two conductor tracks are arranged at two opposite edges of the first electrode, the luminous area of the organic light-emitting component is situated in the transverse direction between the conductor tracks.

The two conductor tracks may have contact made with them on a same side of the first electrode by an electrical connection element. To this end, each conductor track can have contact made with it by an electrical connection element of its own. Alternatively, it is also possible for the two conductor tracks to have contact made with them by a common connection element. Contact being made on a same side of the first electrode means that the contact is made on a narrow side of the conductor tracks on the same side of the first electrode. During operation of the organic light-emitting component, the connection element(s) is/are used to supply the two conductor tracks, at an operating voltage, with a respective operating current that flows through the organic functional layer stack to the second electrode. The conductor tracks are preferably in continuous contact with the first electrode so that an operating current supplied to the conductor tracks can be supplied to the first electrode over the entire length of the conductor tracks. Alternatively, it may be possible for the conductor tracks to be arranged continuously next to the first electrode and make contact with the first electrode in combed fashion, that is to say with contact regions isolated from one another by small interruptions. The sheet resistance of the conductor tracks and the sheet resistance of the first electrode results in a voltage drop in the longitudinal direction in each conductor track during operation. The voltage drop brings about a gradient in the operating current density in the organic functional layer stack in the longitudinal direction, which in turn results in a luminous density gradient on the luminous area in one direction following the longitudinal direction.

The organic light-emitting component may have a characteristic r provided by r=dV/dj, where V denotes an operating voltage and j denotes an operating current density and dV/dj is the mathematical derivative of the operating voltage with respect to the operating current density. The unit of r is $\Omega cm^2$, and r thus describes the differential resistance of an organic light-emitting component having a particular area. In this case, a "resistance times area" appears, the reason for which is that an increase in the area of the organic light-emitting component corresponds to a parallel connection of resistances where, rather than the resistances, the reciprocals thereof add up. To interpret the characteristic of the organic light-emitting component, it is possible to use an organic functional layer stack between two electrodes, for example, that matches the organic functional layer stack of the organic light-emitting component but has an active area that is as small as possible. In the thermally steady state, that is to say following operation of such a reference component for a period of typically around 10 minutes for the operating point that is to be determined, it is possible to ascertain r.

An operating point $r=r_A$ on the characteristic may be chosen such that it holds that: $0.75 \leq U \leq 1$. Preferably, $r=r_A$ is chosen such that it holds that: $0.8 \leq U \leq 0.99$. Particularly preferably, $r=r_A$ is chosen such that it holds that: $U=0.8$.

In this case, U is a measure of the homogeneity of the luminous density on the luminous area, wherein it holds that: $U=1-(1-H)/(1+H)$, $H=\cos h^{-1}(L/\Lambda)$ and $\Lambda=(r/R)^{0.5}$. In this case, it holds that: $L=0.5 \times d$, where d denotes a distance between the conductor tracks in a direction transverse to the longitudinal direction. In particular, d therefore denotes the width of the luminous area, this width being measured in centimeters during customary use of the units for the individual parameters. R denotes the sheet resistance of the first electrode.

The previously indicated relationships for U, H and $\Lambda$ are obtained from an analytical model in which strip-shaped OLEDs are considered. $\Lambda$ denotes a characteristic length obtained from the sheet resistance R of the first electrode and the characteristic r, that is to say the differential resistance of the organic light-emitting component. Comparisons with simulations have shown that the analytical model on which the relationships indicated above are based describes the behavior of the organic light-emitting component with sufficient accuracy. Of particular significance is what homogeneity is achieved by the organic light-emitting component. The smaller the parameter H, that is to say the smaller the parameter U also is, the greater the voltage drop across the luminous area and the greater the luminous density gradient.

The effect that can be achieved by the previously described suitably chosen operating point $r=r_A$ is that an acceptable homogeneity for the luminous density in the transverse direction is achieved over the active area and hence over the luminous area of the organic light-emitting component, while at the same time a large luminous density gradient in a longitudinal direction is achieved. The relationship between r and the operating current density j on the basis of the characteristic of the organic light-emitting component assigns an operating current density $j_A$ to the operating point $r=r_A$ determined in this manner. At this juncture and below, the parameter "operating current density" denotes the operating current density averaged over the luminous area.

The organic light-emitting component may be operated with an operating current between the connection element(s) and the second electrode, which is chosen such that the current density averaged over the luminous area is equal to the operating current density $j_A$. In this case, the organic light-emitting component is thus, in simplified terms, operated at the operating current density $j_A$. To adjust the luminosity of the luminous area given an equal luminous density gradient, the operating current and hence the associated operating current density $j_A$ averaged over the luminous area can be modulated by pulse width modulation (PWM), with only the pulse length being varied and the pulse amplitude being kept at a constant value in accordance with the desired operating current density $j_A$. To set a maximum luminosity for the luminous area when the organic light-emitting component is operated at the operating point $r=r_A$, the operating current density $j_A$ can be produced by a constant current.

To change the luminous density gradient, the operating point $r=r_A$ and hence the corresponding operating current density $j_A$ averaged over the luminous area can be varied. By way of example, a first operating point $r=r_{A1}$ having a corresponding operating current density $j_{A1}$ and a second operating point $r=r_{A2}$ having a corresponding operating current density $j_{A2}$ are chosen, wherein it holds that: $j_{A2}>j_{A1}$. For the two operating points $r=r_{A1}$ and $r=r_{A2}$, the relationship indicated further above for the homogeneity U holds in each case. During operation of the organic light-emitting component, a variation in the operating current present between the connection elements and the second electrode varies the operating current density j averaged over the luminous area, with $j_{A1} \leq j \leq j_{A2}$, which varies the luminous density gradient on the luminous area. A suitable choice of the organic functional layer stack makes it possible to achieve not only the variation in the luminous density gradient but also a variation in a color gradient over the luminous area.

Particularly preferably, the pulse width modulation can be used to keep the average over time at a constant value for each operating current density j with $j_{A1} \leq j \leq j_{A2}$. The effect that can be achieved by this is that the average luminous density or luminosity of the luminous area remains constant, while the luminous density gradient on the luminous area can be altered. The pulse width modulation method described here therefore allows production of an equal luminosity for different luminous density gradients.

Each conductor track may have a sheet resistance of greater than or equal to 10 mΩ/sq and less than or equal to 1000 mΩ/sq. For a preferred component length in the longitudinal direction in the region of greater than or equal to 3 cm and less than or equal to 100 cm, preferably greater than or equal to 15 cm and less than or equal to 25 cm, and a typical width of the conductor tracks of 2 mm in the transverse direction, such a sheet resistance of the conductor tracks allows a suitable luminous density gradient to be achieved in the longitudinal direction. Particularly preferably, the sheet resistance of the conductor tracks is approximately 70 mΩ/sq.

The first electrode, rather than the two previously described conductor tracks arranged on opposite sides of the first electrode, may have contact made with it by at least one first electrical connection element at an edge of the first electrode. Taking account of the sheet resistance of the first electrode, during operation of the organic light-emitting component, there is a voltage drop in the first electrode in a direction leading away from the at least one first connection element, which voltage drop brings about a luminous density gradient on the luminous area in the direction leading away from the at least one first connection element.

As already described earlier on, the organic light-emitting component has a characteristic $r=dV/dj$. When contact is made with the first electrode by the at least one first connection element, an operating point $r=r_A$ can be chosen such that it holds that: $U \leq 0.2$, with $U=1-(1-H)/(1+H)$, $H=\cos h^{-1}(L/\Lambda)$ and $\Lambda=(r/R)^{0.5}$. In this case, it holds that $L=d$, where d denotes a width of the luminous area transversely to the edge of the first electrode, at which the at least one connection element is arranged. R is, as described above, the sheet resistance of the first electrode. In this way, a pronounced luminous density gradient is produced in the transverse direction.

The operating point $r=r_A$ determines an operating current density $j_A$ that can achieve the previously described voltage drop and hence a luminous density gradient on the luminous area leading away from the first connection element. As described earlier, for the example having the two conductor tracks on opposite sides of the first electrode, the organic light-emitting component can be operated with a constant operating current in accordance with the current density $j_A$. To vary the luminosity of the luminous area for an equal luminous density gradient, the operating current and hence the associated operating current density $j_A$ averaged over the luminous area can be modulated by pulse width modulation (PWM), with only the pulse length being varied and the pulse amplitude being kept at a constant value in accordance with the desired operating current density $j_A$. In addition, it is also possible to vary the luminous density gradient by operating the organic light-emitting component with an operating current modulated by pulse width modulation, the amplitude of the current pulses of the PWM signal being chosen such that the operating current density $j_A$ corresponding to the operating point $r=r_A$ is obtained on average over time and in a manner averaged over the luminous area of the organic light-emitting component.

A first operating point $r=r_{A1}$ having a corresponding operating current density $j_{A1}$ may be chosen, for which it holds that $U \geq 0.8$. In addition, a second operating point $r=r_{A2}$ having a corresponding operating current density $j_{A2}$ may be chosen, for which it holds that $U \geq 0.8$. While the second operating point brings about a luminous density gradient in the transverse direction on the luminous area, the first operating point prompts a much smaller or else absolutely no luminous density gradient to be able to be perceived on the luminous area. A variation in the operating current present between the at least one connection element and the second electrode and hence in the operating current density j with $j_{A1} \leq j \leq j_{A2}$ can produce a variation between a luminous density gradient on the luminous area for the second operating point $r_{42}$ and no luminous density gradient on the luminous area for the first operating point $r_{41}$. In particular, the operating current densities j with $j_{A1} \leq j \leq j_{A2}$ can be modulated by pulse width modulation such that an operating current density averaged over time is kept at a constant value for each operating current density j with $j_{A1} \leq j \leq j_{A2}$, as a result of which the luminous density gradient can be varied for a constant luminosity of the luminous area.

The at least one connection element can supply current to the first electrode on a point-by-point basis or, by way of example, also over an edge region in a longitudinal direction. By way of example, the at least one connection element may also have a conductor track used to make contact with a portion or else the entire edge region of the first electrode (of an edge). In contrast to the example with the two conductor tracks on the opposite sides of the first electrode, however, this example has no intention of a voltage drop in the longitudinal direction in the conductor track.

The organic light-emitting component may have a plurality of electrical connection elements next to one another along the same edge of the first electrode. In other words, at least two or more connection elements may be arranged next to one another in a longitudinal direction of the first electrode at the same edge. In addition, it may also be possible for at least one further connection element or a plurality of further connection elements to be arranged at an edge of the first electrode that is opposite the edge having the at least one first electrical connection element. In this case, the connection elements at the two opposite edges may each be arranged with an offset from one another in a longitudinal direction. Furthermore, it is also possible for a plurality of connection elements to be arranged at each of a plurality of edges of the first electrode. Arrangement of a plurality of electrical connection elements at the same edge or at different edges of the first electrode allows further influencing of the luminous density gradients on the luminous area to be achieved. By way of example, the individual electrical connection elements can be operated at different electrical potentials, with additional modulation of the luminous density being able to be produced by a variation in the electrical potentials on the different electrical connection elements over time.

The first electrode in the previously described respective examples may have a higher electrical sheet resistance than the second electrode. Whereas it is a constant endeavor, with ordinary organic light-emitting components emitting as homogeneously as possible, to keep the sheet resistance of the electrodes as low as possible, an organic light-emitting component with a certain, not excessively low sheet resistance of the first electrode is advantageous in the methods described here. By way of example, it may be advantageous if the first electrode has an electrical sheet resistance at least ten times and preferably at least one hundred times that of the second electrode. The electrical sheet resistance of the first electrode, which should not be chosen to be too low and which can therefore exceed the sheet resistance of the second electrode by at least a factor of 10 and preferably by at least a factor of 50 and particularly preferably by at least a factor of 100, can bring about a desired voltage drop in the first electrode from one or more electrical connection elements and/or conductor tracks according to the previously described examples as the distance therefrom increases.

Preferably, the first electrode can have a sheet resistance R with $0.4 \ \Omega/sq \leq R \leq 100 \ \Omega/sq$ or with $1 \ \Omega/sq \leq R \leq 20 \ \Omega/sq$. Particularly preferably, the sheet resistance R of the first electrode may be in a range of greater than or equal to $2 \ \Omega/sq$ and less than or equal to $15 \ \Omega/sq$. By way of example, the sheet resistance of the first electrode may be able to be set by the choice of material and/or by the thickness of the first electrode.

By way of example, the first electrode can have a transparent conductive oxide, while the second electrode has a metal. In particular, the first electrode may be formed by a transparent conductive oxide or have at least one layer that is formed by a transparent conductive oxide, while the second electrode is formed by a metal or has at least one layer that is formed by a metal.

Transparent conductive oxides (TCO) are transparent, conductive materials, normally metal oxides such as zinc oxide, tin oxide, cadmium oxide, titanium oxide, indium oxide or indium tin oxide (ITO). Besides binary metal oxide compounds such as $ZnO$, $SnO_2$ or $In_2O_3$, ternary metal oxide compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides, belong to the group of TCOs. In addition, the TCOs are not necessarily based on a stoichiometric composition and may also be p or n doped.

The metal of the second electrode can preferably be selected from aluminum, barium, indium, silver, gold, magnesium, copper, calcium and lithium and also compounds, combinations and alloys thereof. In particular, the second electrode can have Ag, Al or alloys with these, for example, Ag:Mg, Ag:Ca, Mg:Al. In addition, the second electrode can also have one or more of the aforementioned TCO materials. By way of example, the thickness and composition of the second electrode may be chosen such that it has a lower sheet resistance than the first electrode. Particularly the thickness of a metal second electrode may be of such magnitude that the second electrode is not transparent and additionally at least to some extent reflective. A combination of metal and TCO layers also allows the formation of an at least partially transparent second electrode with a low sheet resistance.

As an alternative to a TCO, the first electrode may also have a transparent metal or be formed therefrom. At this juncture and below, a transparent metal means a metal layer having such a slight thickness that at least some of the light produced by the organic light-emitting component during operation can be radiated by the metal layer. The thickness of a transparent metal layer may be between a few nanometers and 30 nm, for example, depending on the material and the light that is to be shone through. By way of example, a silver layer having a thickness of approximately 20 nm is transparent and has a sheet resistance of approximately 5 $\Omega$/sq.

In addition, it may also be possible for the first electrode to be in the form of what is known as a percolation electrode and have a transparent organic material that is filled with conductive particles.

The organic light-emitting component may have a luminous area having a rectangular form or a free form derived from a rectangle. The form of the luminous area can be determined particularly by the form of the electrodes and of the organic functional layer stack. When the luminous area has a rectangular form, the first electrode has edges that are straight and parallel. When a luminous area has a free form derived from a rectangle, the first electrode has at least one or more edges that are curved. In this case, the luminous area and hence also the first electrode can still have four corners, for example.

The organic functional layer stack may have at least two organic light-emitting layers that, during operation, emit light having different wavelengths. Between one of the electrodes and the organic light-emitting layers there may be at least two organic functional layers having an energy barrier for charge carriers in the direction of the organic functional layers. This means that the charge carriers have to overcome the energy barrier on their way from the electrode to the organic light-emitting layers. The energy barrier can preferably be at least 0.1 eV.

An organic functional layer stack having an energy barrier for charge carriers in the direction of the organic functional layers can prompt the organic functional layer stack to have dependency for the emission color on the applied operating voltage. The color of the light emitted by the organic light-emitting component is dependent on the number of photons produced in each of the at least two organic functional layers. If charge carriers from one of the electrodes have to overcome an energy barrier in the direction of the organic light-emitting layers, that is to say holes emitted by the anode to the organic functional layer stack or electrons emitted by the cathode to the organic functional layer stack, then at a particular operating voltage a certain number of charge carriers per unit time can overcome the energy barrier. These will preferably recombine with oppositely charged charge carriers in the organic light-emitting layer closer to the energy barrier so that fewer charge carriers are available for recombination in an organic light-emitting layer further away from the energy barrier. If the operating voltage is increased, more charge carriers from the charge carrier barrier can get through the closest organic light-emitting layer to an organic light-emitting layer arranged downstream thereof so that the latter layer can produce more photons relative to the closer organic light-emitting layer. If organic light-emitting layers having different emission colors are used, this means that variation of the operating voltage and accordingly the operating current density allows the relative intensity of the colors emitted by the organic light-emitting layers to vary with a change in the operating voltage. By way of example, the variation can be achieved by a previously described voltage drop in the first electrode and/or by a variation, over time, in the operating voltage applied to the organic light-emitting component. In the previously described methods of operating the organic light-emitting component, it is therefore also possible to produce a color gradient in addition to a luminous density gradient since the voltage drop described above in the conductor tracks or in the first electrode can bring about not only a luminous density variation but accordingly also a color variation.

The methods described here can be used to produce a desired luminous density gradient in the longitudinal or transverse direction of the luminous area, which luminous density gradient can be varied over time and/or in space, without the need to take complex physical measures on the organic light-emitting component. By contrast, there is an approach in the prior art in which contact is made with the area of an electrode such as the anode, at a few points not just at the edge but rather also in the center. A corresponding component is described in WO 2012/052886 A2, in which what is known as laser drilling is used to produce contact holes from the cathode to the underlying anode, and contact is then made with the contact holes by contact elements. This allows different amounts of current to be introduced at different points on the anode and therefore irregular homogeneities to be achieved. The production of contacts not just at the edge but also on the area and, by way of example, in the center of an electrode can be implemented only by complex additional method steps during manufacture, however.

In contrast to the prior art, the organic light-emitting component used for the methods described here has a luminous area free of electrical contacts on the area and remote from the edge of the electrodes. Hence, in the organic light-emitting component described here, it is not necessary to structure the luminous area or arrange additional contacts within the edge at the center of the luminous area. Instead, luminous density gradients and/or color gradients are produced by specifically chosen operating conditions and specifically chosen contact geometries. Each of the electrical connection elements described supplies to the entire first electrode and hence to the same luminous area, however.

Further advantages and developments will emerge from the examples described below in conjunction with the figures.

In the examples and figures, elements that are the same, or of the same type or have the same effect can each be provided with the same reference symbols. The elements presented and the ratios of magnitudes thereof with respect to one another are not intended to be regarded as to scale, but rather individual elements such as layers, parts, components and regions, may be presented in exaggerated magnitude to assist presentation and/or to assist comprehension.

FIG. 1 shows a detail from the layer structure of an organic light-emitting component 100 according to an example. The design of the organic light-emitting component 100 is purely exemplary and not intended to be understood as limiting for the subsequent examples.

The organic light-emitting component 100 is in the form of an organic light emitting diode (OLED) and has, between a first electrode 2 and a second electrode 3, an organic functional layer stack 4 having at least one organic light-emitting layer 5. The electrodes 2, 3 and the organic functional layer stack 4 are arranged on a substrate 1. The substrate 1 is of transparent design, for example, in the form of a glass plate or glass layer. This has the first electrode 2 put on above it, which, by way of example, has a transparent conductive oxide such as ITO or another material cited above in a general section for the first electrode.

The second electrode 3 is in reflective form and has, in particular, a metal that is described above in the general section, for example, Ag and/or Al. In particular, the first electrode 2 may be in the form of an anode and the second electrode 3 may be in the form of a cathode, or vice versa.

In particular, the materials and the thicknesses of the first electrode 2 and the second electrode 3 are chosen such that the first electrode 2 has a higher electrical sheet resistance than the second electrode 3. For the examples described below, it is particularly advantageous if the first electrode 2 has an electrical sheet resistance that is at least ten times and preferably at least one hundred times greater than that of the second electrode 3.

The organic light-emitting component 100 is a bottom emitter in the example shown and, during operation, emits light that is produced in the at least one organic functional layer 5 through the first electrode 2 in transparent form and the transparent substrate 1. By way of example, it is alternatively possible for the organic light-emitting component 100 to be, rather than in the bottom emitter configuration shown, in the form of a top emitter or in the form of a transparent organic light-emitting component that emits on both sides, as described above in the general section.

The organic functional layer stack 4 having the at least one organic light-emitting layer 5 additionally has, by way of example, one or more organic functional layers selected from hole injection layers, hole transport layers, electron blocking layers, hole blocking layers, electron transport layers and electron injection layers, suitable to conduct holes and electrons to the at least one organic light-emitting layer 5 or blocking the respective transport. In addition, it is also possible for there to be a plurality of light-emitting layers. Suitable layer structures for the organic functional layer stack 4 are known and are therefore not explained further at this juncture.

Arranged on the second electrode 3 is an encapsulation layer 6. This can, as shown in FIG. 1, be placed on the second electrode 3, for example, directly. In addition, it is also possible for further layers, for example, intermediate or protective layers, to be arranged between the second electrodes 3 and the encapsulation layer 6 or for a region to be provided that contains a gas, a gel or a liquid. In particular, the encapsulation layer 6 may be in the form of a thin film encapsulation, for example, that has a or a plurality of thin layers that, independently or at least together, can prompt the most hermetically sealed encapsulation possible for the organic functional layer stack 4 and the electrodes 2, 3 with respect to harmful substances. Such encapsulation layers are described in US 2011/0121354 A1, US 2011/0114992 A1 and US 2011/0049730 A1, for example, which are expressly incorporated herein by reference in this regard. Alternatively, it is also possible for the encapsulation layer to be formed, by way of example, by a glass layer, for example, a glass plate or a glass cover, that is put on over the organic functional layer stack 4 and the electrodes 2, 3 on the substrate 1. The glass layer can form a cavity over the electrodes 2, 3 and the organic functional layer stack 4, in which cavity a getter material for absorbing harmful substances can be arranged.

The organic light-emitting components shown in the examples below may have, purely by way of example, a layer structure as shown in FIG. 1. Reference symbols and references to individual layers of an organic light-emitting component can therefore additionally also relate to the design described and shown in FIG. 1.

Figure 2:
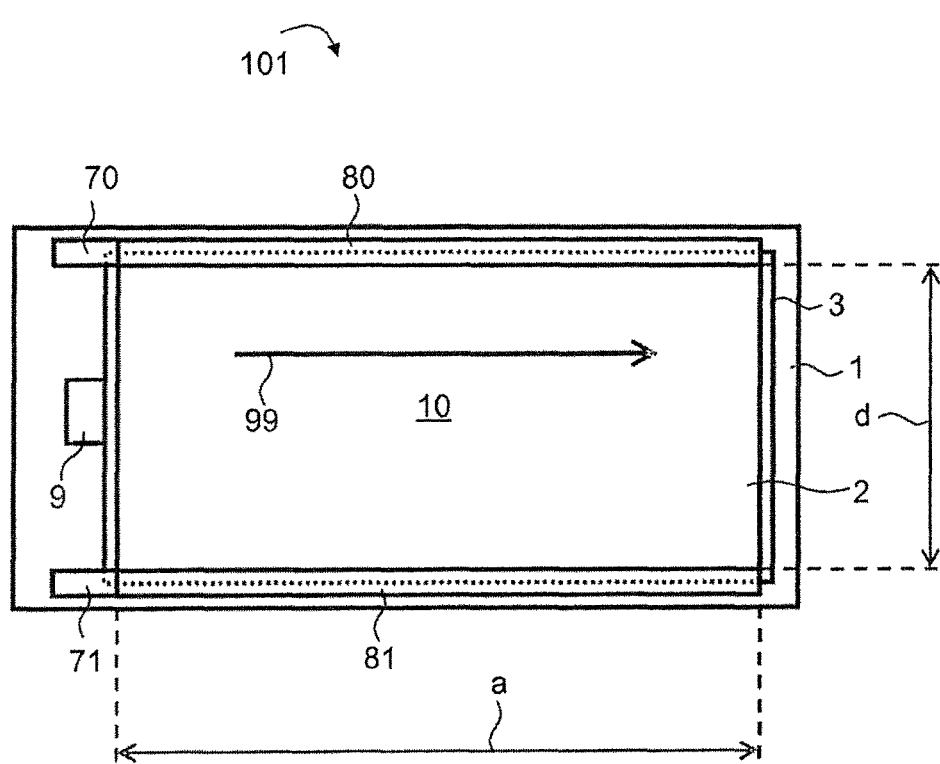
FIGS. 2 and 3 show schematic illustrations of organic light-emitting components according to further examples.

FIG. 2 shows an organic light-emitting component 101 according to a further example that is used for a method as described below. The representation of the component 101 corresponds to a view of the luminous area 10 of the component 101, that is to say to a plan view of the component 101. In a bottom emitter as described in conjunction with FIG. 1, the representation of the organic light-emitting component 101 in FIG. 2 corresponds to a view of that side of the substrate 1 averted from the organic functional layer stack 4 or through the substrate 1 onto the layers arranged above it.

In addition to the electrodes 2 and 3 and the organic functional layer stack between them, the organic light-emitting component 101 has conductor tracks 80, 81 on the substrate 2 that are in contact with the first electrode 2 and extend at each of two opposite edges of the first electrode in a longitudinal direction along the respective edge that corresponds to the direction of the arrow 99. In particular, the conductor tracks 80, 81 extend over the entire edge of the first electrode 2 in each case so that the conductor tracks 80, 81 each make contact with the first electrode 2 over the entire length denoted by a, which corresponds to the length of the luminous area 10. Transversely to the longitudinal direction, the conductor tracks 80, 81 are at a distance d that corresponds to the width of the luminous area 10.

The conductor tracks have a sheet resistance of greater than or equal to 40 m$\Omega$/sq and less than or equal to 100 m$\Omega$/sq and preferably of approximately 70 m$\Omega$/sq. In this case, the conductor tracks 80, 81 have Cu, Cr, Al and/or Mo, for example. By way of example, the conductor tracks 80, 81 can also be formed from a layer combination with a plurality of materials, for example, Cr/Al/Cr or Mo/Al/Mo. The two conductor tracks 80, 81 that are laterally in continuous contact with the first electrode 2 and hence with the active area of the organic light-emitting component 101 have a typical width of approximately 2 mm. The length a of the active area and hence also of the luminous area 10 is preferably 15 to 25 cm. The sheet resistance R of the first electrode 2 is preferably 1 $\Omega$/sq$\leq$R$\leq$20 $\Omega$/sq and preferably approximately 15 $\Omega$/sq.

In addition, connection elements 70, 71 that make electrical contact with the conductor tracks 80, 81 are arranged on the substrate 1, the conductor tracks 80, 81 having contact made with them on a same side of the first electrode 2 by the connection elements 70, 71. As an alternative to two connection elements 70, 71 arranged in isolation, one connection element that makes contact with both conductor tracks 80, 81 together may also be provided. The connection elements 70, 71 and the respective associated conductor track 80, 81 may be in single-piece form, for example, so that the electrical connection elements 70, 71 can be formed at least to some extent by the same material as the conductor track 80, 81. Alternatively, the connection elements 70, 71 can also be formed by a different material than the conductor tracks 80, 81. By way of example, the electrical connection elements can form contact areas for bonding contacts, solder contacts, electrically conductive adhesive contacts or plug-in contacts. In addition, it is also possible for the connection elements 70, 71 to have electrical contact made with them by electrical conductor tracks, which can run on the substrate 1, and/or by electrical vias, which can extend through the substrate 1 so that electrical connection of the first electrode 2 can be effected regardless of the specific position of the electrical connection elements 70, 71 and the conductor tracks 80, 81, for example, at one or more lateral edges or on a reverse of the substrate 1.

The second electrode 3 can have contact made with it by a further connection element 9, which is arranged on the same side as the connection elements 70, 71 for the conductor tracks 80, 81, for example, as seen from the first electrode 2. Since the second electrode 3 preferably has a much higher conductivity and hence a much lower sheet resistance than the first electrode 2, the electrical contact with the second electrode 3 can also be made from one or more other sides and/or using a plurality of connection elements.

Owing to the sheet resistance of the conductor tracks 80, 81, there is a voltage drop in the longitudinal direction in each conductor track 80, 81 during operation of the organic light-emitting component 101. As the distance from the connection elements 70, 71 increases in the longitudinal direction, the local operating voltage in the region of the luminous area 10 therefore falls so that a smaller local operating current or a lower local operating current density is impressed into the organic functional layer stack 4 as a distance from the connection elements 70, 71 increases. This prompts a luminous density gradient 99—indicated by the arrow—on the luminous area 10 in a direction following the longitudinal direction.

Figure 3:
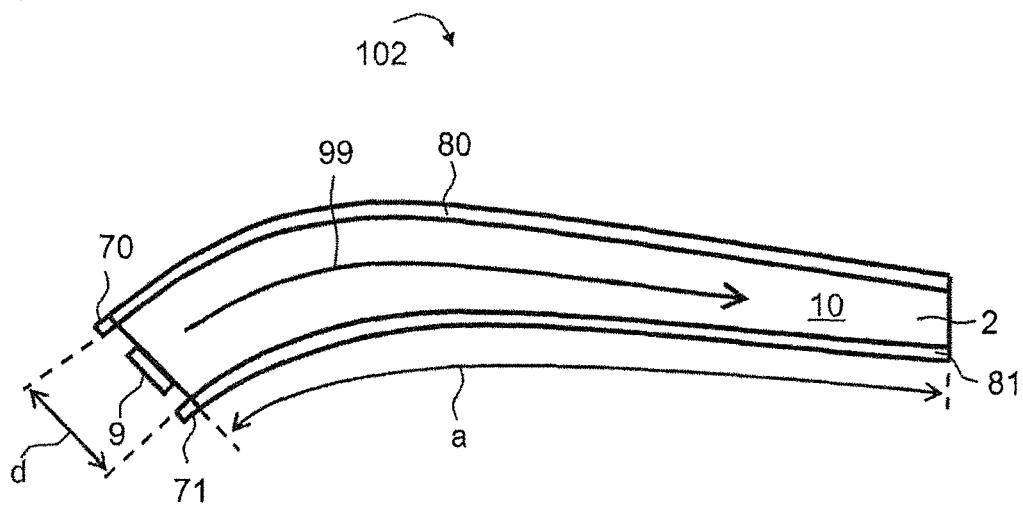

FIG. 3 shows a further example of an organic light-emitting component 102 that, compared to the organic light-emitting component 101 of FIG. 2, has a free form derived from the rectangular form of the component 101, the substrate 1 not being shown. The elements and dimensions shown in FIG. 3 correspond to those of the component 101 of FIG. 2.

The description below concerning a method of operating an organic light-emitting component relates equally to the organic light-emitting components 101 and 102 of FIGS. 2 and 3.

The organic light-emitting component 101, 102 has a characteristic r=dV/dj, as described above in the general section.

For operation of the component 101, 102, an operating point $r=r_A$ is chosen so that it holds that: $0.75 \leq U \leq 1$, with $U=1-(1-H)/(1+H)$, $H=\cos h^{-1}(L/\Lambda)$ and $\Lambda=(r/R)^{0.5}$, where $L=0.5 \times d$ and R is the previously described sheet resistance of the first electrode 2. Particularly preferably, the operating point $r=r_A$ can also be chosen such that U=0.8.

The operating point has an associated current density $j_A$ that corresponds to the average current density present over the active area of the component 101, 102, that is to say over the luminous area 10, during operation. As a result, it is possible to achieve an acceptable level of homogeneity in the transverse direction, that is to say perpendicular to the longitudinal direction along the arrow 99, with simultaneous maximization of a luminous density gradient 99 in the longitudinal direction. To set a desired luminosity for the luminous area 10, the organic light-emitting component 101, 102 is operated with an operating current modulated by pulse width modulation rather than with a constant operating current, wherein the operating current associated with the operating point $r_A$ and hence the associated operating current density $j_A$ averaged over the luminous area are retained as the amplitude of the PWM signal.

Figure 4:
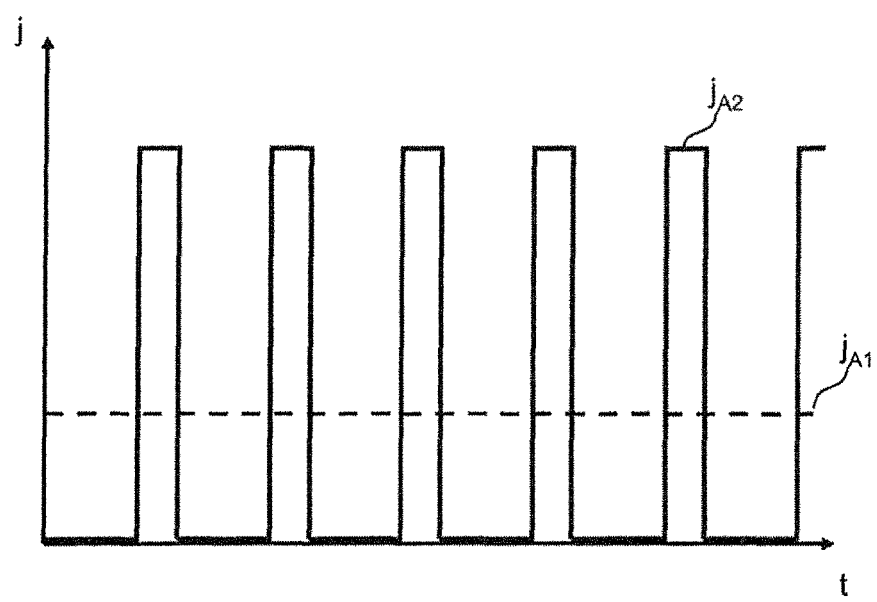
FIG. 4 shows a schematic illustration of operating parameters in a method of operating an organic light-emitting component according to a further example.

In conjunction with FIG. 4, it is also possible for the luminous density of the luminous area 10 to be kept at a constant value while the luminous density gradient 99 is varied in the longitudinal direction. To this end, a first operating point $r=r_{A1}$ having an associated operating current density $j_{A1}$ and a second operating point $r=r_{A2}$ having a corresponding operating current density $j_{A2}$ can be chosen, where it holds that: $j_{A2} > j_{A1}$. For the operating points $r=r_{A1}$ and $r=r_{A2}$, it holds that $0.75 \leq U \leq 0.95$.

At the higher operating current density $j_{A2}$ at the second operating point $r=r_{A2}$, there is a greater voltage drop in the longitudinal direction in the conductor tracks 80, 81, which means that this achieves a greater luminous density gradient than in operation at the first operating point $r=r_{A1}$ with an operating current density $j_{A1}$. To keep the luminosity of the luminous area 10, that is to say the entire luminous density of the luminous area 10, the same at both operating points, the operating current at least at the second operating point $r=r_{A2}$ is modulated by pulse width modulation such that the average operating current density corresponds to the operating current density $j_{A1}$ at the first operating point $r=r_{A1}$ on average over time. At the first operating point $r=r_{A1}$, it is also possible to apply a constant current having an operating current density $j_{A1}$, for example. Corresponding operating current densities $j_{A1}$ and $j_{A2}$ have their time profile shown in FIG. 4. A change in the operating current density j between the two operating points $r_{A1}$ and $r_{A2}$, that is to say for operating current densities $j_{A1} < j < j_{A2}$, can vary the luminous density gradient 99. Suitable pulse width modulation of the operating current as described can then keep the luminosity of the luminous area at a constant value regardless of the luminous density gradient 99.

With a sheet resistance R=15 Ω/sq for the first electrode 2 and a component width of d=2.8 cm, the first operating point $r=r_{A1}=70$ Ωcm² and the second operating point $r=r_{A2}=35$ Ωcm² are chosen, for example. In accordance with the aforementioned formulae, this results in Λ=2.16, H=0.82 and U=0.92 for the first operating point $r=r_{A1}$, while the values Λ=1.53, H=0.69 and U=0.80 are obtained for the second operating point $r=r_{A2}$.

The first operating point $r=r_{A1}$ therefore gives U=0.92, while enhanced operating conditions at the second operating point $r=r_{A2}$ make U approximately 0.8. Since the voltage drop across the luminous area is much higher at the second operating point than the first operating point, a greater luminous density gradient is achieved at the second operating point. As described previously, pulse width modulation can be used to regulate the average luminous density of the luminous area 10 such that a constant luminous density for the luminous area 10 is achieved at both operating points and also at operating points that are between $r_{A1}$ and $r_{A2}$. The numerical values described in conjunction with FIGS. 2 to 4 are purely exemplary and are not intended to be understood as limiting.

Figure 15:
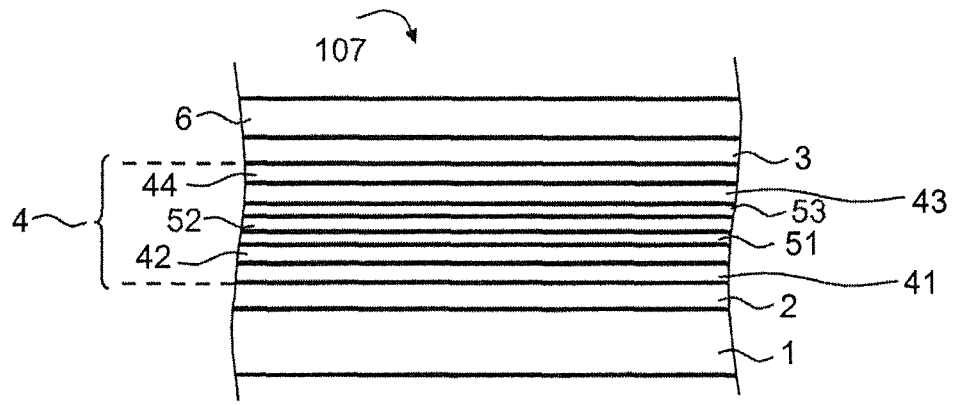
FIGS. 15 to 17 show schematic illustrations of an organic light-emitting component and of energy states in organic functional layers during the operation of organic light-emitting components according to further examples.
Figure 16:
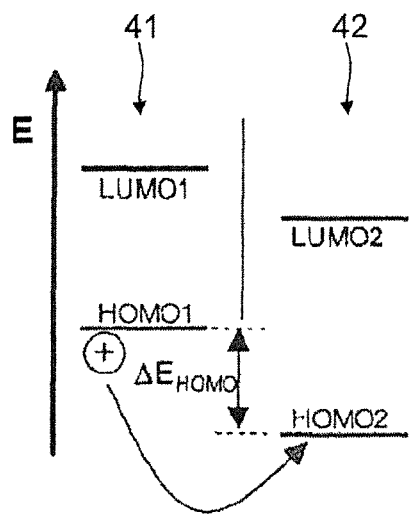
Figure 17:
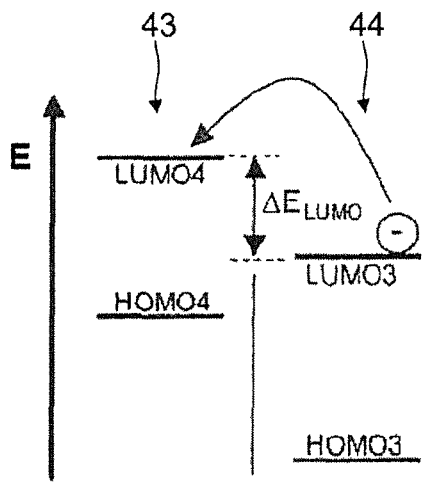

If, in addition to a luminous density gradient, a color gradient is also intended to be achieved, it is possible to choose an organic light-emitting component that has a pronounced dependency for the emission color on the voltage, as described in conjunction with FIGS. 15 to 17. If, by contrast, only a luminous density gradient is intended to be attained, it is possible to choose an organic functional layer stack that exhibits low dependency for the emission color on the applied voltage or on the operating current density.

Figure 5:
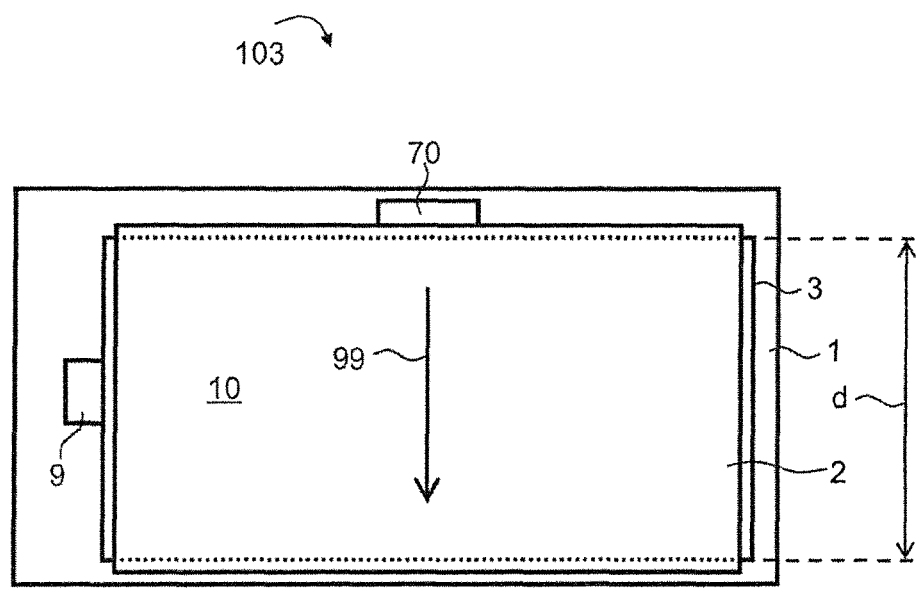
FIGS. 5 to 14 show a schematic illustration of organic light-emitting components or contact connections therefor according to further examples.
Figure 6:
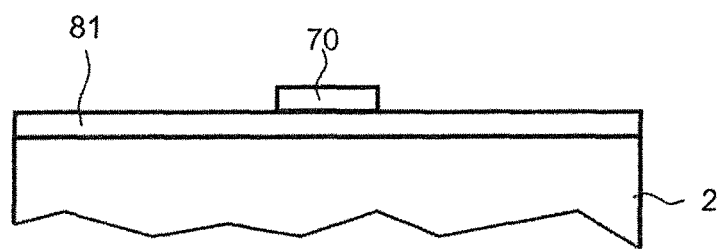
Figure 7:
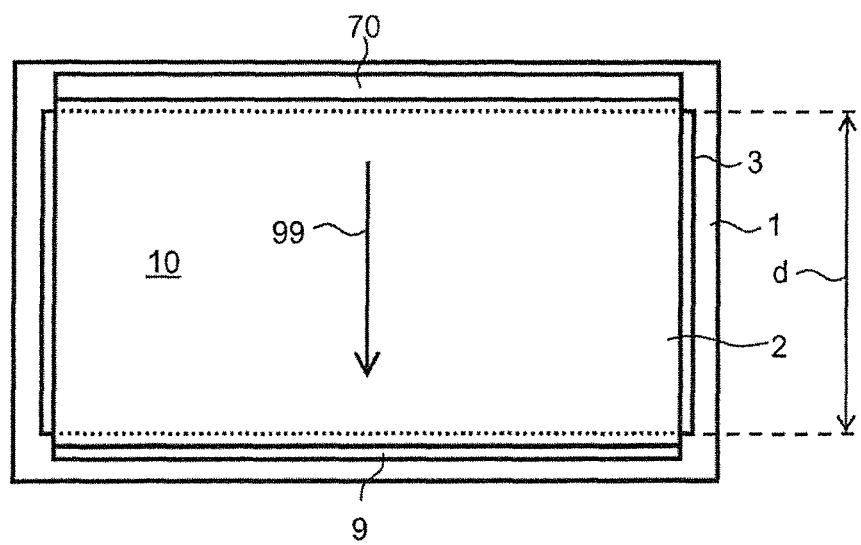

In conjunction with FIGS. 5 to 14, organic light-emitting components and methods of operating them are described that, rather than a luminous density gradient in the longitudinal direction, have a luminous density gradient in the transverse direction, as indicated in FIGS. 5 and 7 by the arrow 99, for example. The description of the Figures that follow relates primarily to the differences over the previous examples.

FIG. 5 shows an example of an organic light-emitting component 103 in which, compared to the previous example, a luminous density gradient is produced not in the longitudinal direction but rather in the transverse direction, as indicated by the arrow 99 in FIG. 5. Compared to the previous example, the organic light-emitting component 103 has at least one first electrical connection element 70 at an edge of the first electrode 2. The edge of the first electrode is an edge in a longitudinal direction at which the at least one first connection element 70, as shown in FIG. 5, can be arranged centrally, for example.

Figure 8:
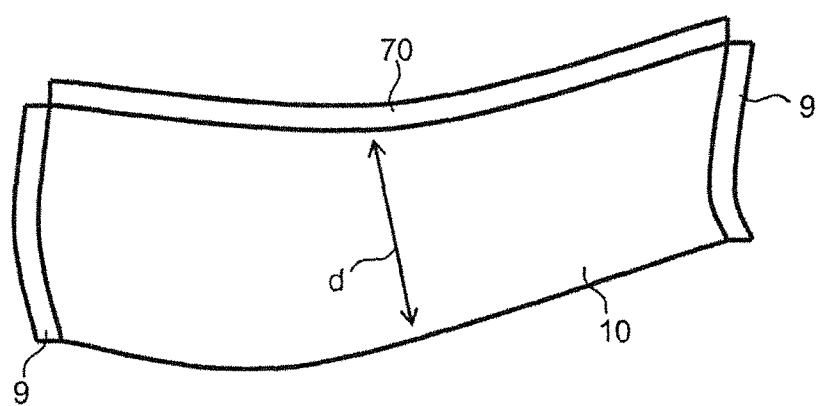
Figure 9:
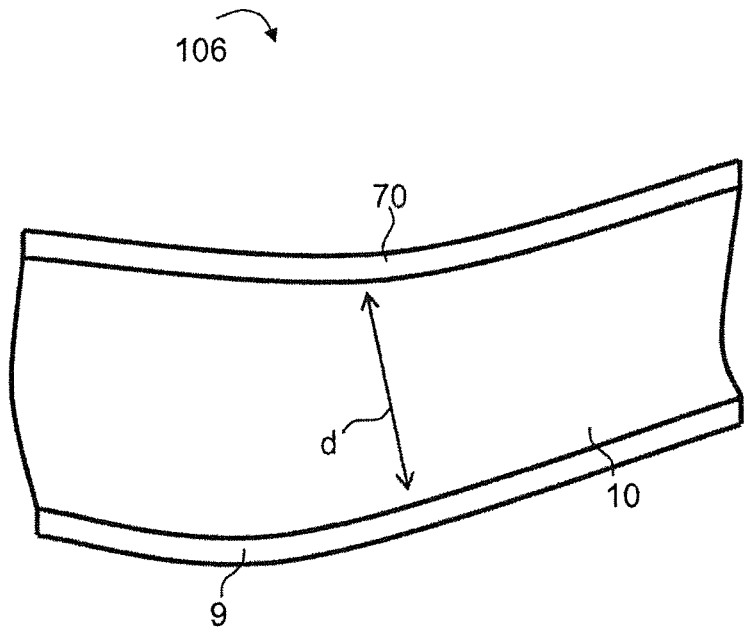

The second electrode 3 can have contact made with it by a further electrical connection element 9, as in the previous example, a much higher conductivity of the second electrode 3 in comparison with the first electrode 2 meaning that the connection element 9 as shown in FIG. 5 can be arranged on one edge side in the transverse direction or else on another edge side of the second electrode 3, as shown in FIGS. 7 to 9.

As in the previous example, the first electrode 2 has a sheet resistance R with 0.4 Ω/sq≤R≤100 Ω/sq. By way of example, the first electrode 2 in the example shown can have a sheet resistance R=2.5 Ω/sq. In the transverse direction, the luminous area 10 has a width d, where d is 5 cm in the example shown.

The electrical sheet resistance of the first electrode means that, during operation of the organic light-emitting component 103, there is a voltage drop in a direction that leads away from at least one first electrical connection element 70, which voltage drop prompts a luminous density gradient 99 on the luminous area 10 in this direction.

As already described in conjunction with the previous example, the organic light-emitting component 103 has a characteristic r with r=dV/dj.

For operation of the organic light-emitting component 103, an operating point $r=r_A$ is chosen such that it holds that: U≤0.2, with U=1−(1−H)/(1+H), H=cos h$^{−1}$ (L/Λ) and Λ=(r/R)$^{0.5}$, where it holds that L=D. The operating point $r=r_A$ has a corresponding operating current density $j_A$ in which a pronounced luminous density gradient 99 can be produced in the transverse direction shown in FIG. 5. For operation of the organic light-emitting component 103, the operating current density $j_A$ can be supplied to the organic functional layer sequence 4 in the form of a constant current. To set the luminosity of the organic light-emitting component 103, that is to say the total luminous density emitted by the luminous area 10, it is possible, as described in conjunction with the previous examples, for an operating current to be supplied to the organic functional layer stack following modulation by pulse width modulation too. The maximum current of the PWM signal, that is to say the amplitude of the pulsed operating current, is chosen such that the operating current density $j_A$ corresponding to the operating point $r=r_A$ is present in the form averaged over the active area, that is to say the luminous area 10, of the organic light-emitting component 103.

In addition, during operation of the organic light-emitting component 103, it is also possible to modulate the magnitude of the luminous density gradient 99, while the total luminous density of the light emitted by the luminous area 10 is kept at a constant value. In other words, the total luminosity of the organic light-emitting component 103 is kept at a constant value while the magnitude of the luminous density gradient 99 over the luminous area 10 is varied or modulated. This can be achieved by choosing an operating point $r=r_{A1}$ at which there is a pronounced luminous density gradient 99, as described previously, for example. The organic light-emitting component 103 is operated with a pulsed operating current having an operating current density amplitude that corresponds to the operating current density $j_{A1}$ at the operating point $r=r_{A1}$. The pulse width of the PWM signal is chosen such that light having a desired luminosity is emitted over the luminous area 10. A variation in the amplitude of the PWM signal by virtue of the choice of a second operating point $r=r_{A2}$ at which a different luminous density gradient 99 is attained can vary the magnitude of the luminous density gradient 99, with a change in the operating current density amplitude of the PWM signal prompting adjustment of the pulse length such that different operating current densities averaged over the luminous area 10 are the same on average over time.

In addition, it is also possible, by way of example, to modulate between a state with a luminous density gradient 99 and a state without a luminous density gradient 99 on the luminous area. To this end, a first operating point $r=r_{A1}$ having a corresponding operating current density $j_{A1}$ is chosen for which it holds that U≥0.8 and for which it is not possible to identify a luminous density gradient on the luminous area 10, while a second operating point $r=r_{A2}$ having a corresponding operating current density $j_{A2}$ is chosen for which it holds that U≤0.2 and for which it is possible to identify a luminous density gradient 99. Analogously to the method described in conjunction with FIG. 4, a variation in the operating current density j averaged over the luminous area with $j_{A1}≤j≤j_{A2}$ allows variation between the two operating points $r=r_{A1}$ and $r=r_{A2}$ so that it is possible to vary between a visible gradient 99 and no visible gradient 99 on the luminous area 10. In this case, the average luminous density is regulated by the PWM signal, as described previously.

With a sheet resistance R=2.5 Ω/sq for the first electrode 2 and a component width of d=5 cm, the first operating point $r=r_{A1}$=70 Ωcm$^2$ and the second operating point $r=r_{A2}$=5 Ωcm$^2$ are chosen, for example. In accordance with the aforementioned formulae, this results in Λ=5.29, H=0.68 and U=0.81 for the first operating point $r=r_{A2}$, while the values Λ=1.41, H=0.06 and U=0.11 are obtained for the second operating point $r=r_{A2}$. The indicated numerical values are purely exemplary and are not intended to be understood as limiting.

FIG. 6 shows a further example of contact being made with the first electrode 2 by at least one first connection element 70, wherein a conductor track 80 preferably without interruptions is arranged on the entire edge region of the contacted edge of the first electrode 2 so that the operating current supplied via the connection element 70 can be supplied to the second electrode over the entire longitudinal side.

FIG. 7 shows a further example of an organic light-emitting component 104 in which the electrical connection element 70 is in a form such that it extends over the entire longitudinal side of the first electrode 2. Purely by way of example, the electrical connection element 9 that contacts the second electrode 3 is arranged on the opposite side in electrical contact with the second electrode 3.

As an alternative to the rectangular forms of the organic light-emitting component that are shown in FIGS. 5 to 7, and particularly of the luminous area 10, the luminous area 10 may also have a free form that is derived from a rectangle, as shown in FIGS. 8 and 9. For the sake of clarity, these Figures show only the luminous area 10 and the electrical connection elements 70 and 9 for making contact with the first and second electrodes.

Figure 10:
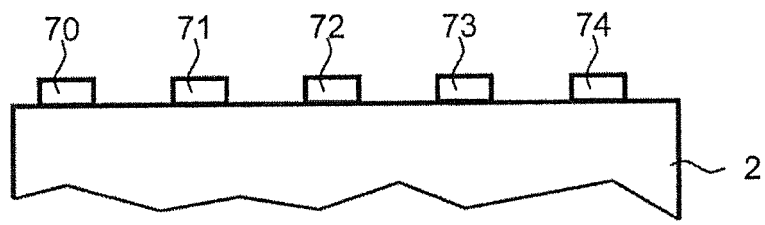

Instead of just a first electrical connection element 70 that contacts the first electrode, the organic light-emitting component used for the method described can also have a plurality of electrical connection elements 70 to 74, for example, arranged along a longitudinal side of the first electrode 2 and hence the luminous area 10, as shown in FIG. 10. As a result, a luminous density gradient can be produced in the transverse direction from each of the connection elements 70 to 74. In addition, modulation of the luminous density in the longitudinal direction can be produced by a variation in the potentials on the different electrical connection elements over time, for example, by variable pulse width modulation which supplies a respective chosen operating current on the basis of the connection elements.

Figure 11:
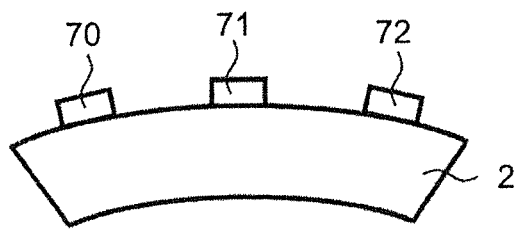

As FIG. 11 shows, the first electrode 2 and hence also the luminous area can have a freeform derived from a rectangle.

Figure 12:
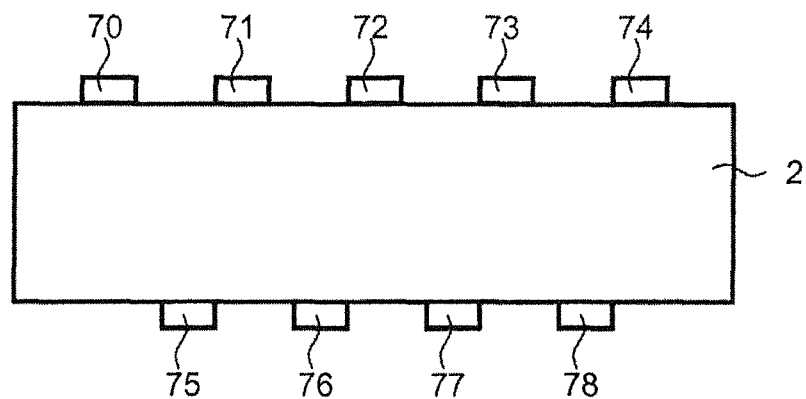
Figure 13:
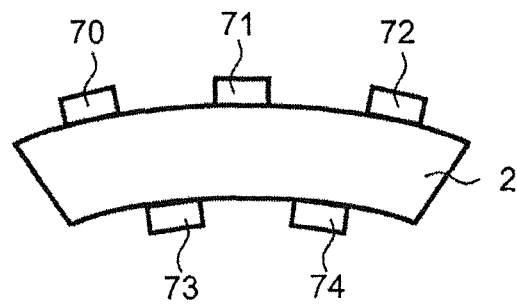
Figure 14:
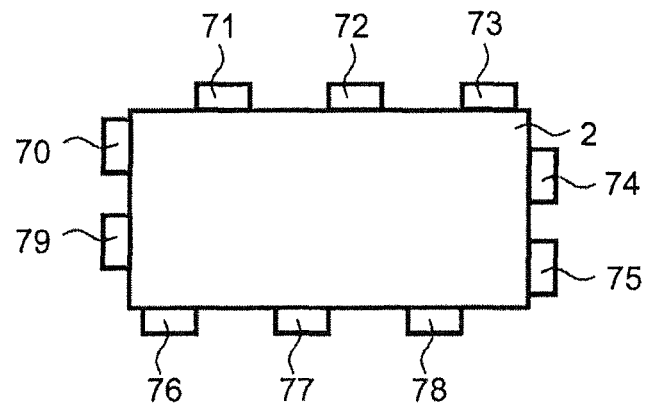

As FIGS. 12 to 14 show, a or a plurality of electrical connection element(s) that contact the first electrode 2 may also be arranged on each of various sides, the electrical connection elements 70 to 79 being able to be arranged on two opposite longitudinal sides, for example, as shown in FIGS. 12 and 13, or else at all the edges of the first electrode 2, as shown in FIG. 14.

Contact with the second electrode 3 can accordingly also be made by a plurality of electrical connection elements or else by just one electrical connection element.

If, in addition to the luminous density gradients, as can be produced using the methods described in conjunction with the preceding examples, a color gradient over the luminous area 10 is also desirable, it is necessary to use an organic light-emitting component that has a current-dependent or voltage-dependent emission color. In conjunction with FIGS. 15 to 17, a corresponding organic light-emitting component 107 is described that shows different emission colors on the basis of the applied operating voltage and hence the supplied operating current density. Since the luminous density gradient, as described in conjunction with the preceding examples, is produced by a voltage drop in a longitudinal or transverse direction of the first electrode 2, in addition to the luminous density gradient it is also possible to produce a color gradient for a corresponding organic light-emitting component.

As FIG. 15 shows, the organic light-emitting component 107 can, to this end, have an organic functional layer stack 4 that, compared to the organic light-emitting component 100 of FIG. 1, has a plurality of organic light-emitting layers 51, 52, 53. Other arrangements having an altered number of organic light-emitting layers and/or having one or more intermediate layers between the organic light-emitting layers are also possible. Instead of the three light-emitting layers shown by way of example in FIG. 15, there may also be just two or else more than three light-emitting layers in the organic functional layer stack 4, for example. Purely by way of example, the organic light-emitting layers 51 to 53 are in a form such that the organic light-emitting layer 51 emits red light during operation, the organic light-emitting layer 52 emits green light during operation and the organic light-emitting layer 53 emits blue light during operation.

In addition, the organic functional layer stack of the organic light-emitting component 107 has at least two organic functional layers 41, 42 and/or 43, 44 that are arranged between one of the electrodes 2, 3 and the organic light-emitting layers 51, 52, 53 and that produce an energy barrier for charge carriers in the direction of the organic light-emitting layers 51, 52, 53. Although corresponding organic functional layers 41, 42 and 43, 44 are shown on both sides in the example shown in FIG. 15, it is particularly advantageous that such layers that produce an energy barrier for charge carriers in the direction of the organic light-emitting layers 51, 52, 53 are arranged just on one side as seen from the organic light-emitting layers 51, 52, 53.

Purely by way of example, the first electrode 2 in the example shown is in the form of an anode and hence in the form of a hole-injecting layer, while the second electrode 3 is in the form of a cathode and hence in the form of an electron-injecting layer. Accordingly, the layers 41, 42 are in the form of hole-conducting layers and the layers 43, 44 are in the form of electron-conducting layers. To achieve a voltage-dependent or current-dependent emission color for the organic functional layer stack 4, it is necessary for the organic functional layers 41, 42 and/or 43, 44 to have an energy barrier for charge carriers in the direction of the organic functional layers 51, 52, 53.

FIG. 16 shows a corresponding energy scheme for an energy barrier in the hole-conducting layers 41, 42. In this case, the energy levels (HOMO: "highest occupied molecular orbital," LUMO: "lowest unoccupied molecular orbital") of the two adjacent organic functional layers 41 and 42 are shown. The materials of the layers 41 and 42 are hole-conducting and have a mobility for holes that is greater than the corresponding mobility for electrons. The absolute value of the energy level HOMO2 of the organic functional layer 42 is greater than the absolute value of the energy level HOMO1 of the organic functional layer 41 so that there is an energy gap $\Delta E_{HOMO}$ at the interface between these two layers or the two energy levels. Preferably, $\Delta E_{HOMO}$ is at least 0.1 eV. During operation of the organic light-emitting component, holes must overcome the energy barrier $\Delta E_{HOMO}$ when changing over from the organic functional layer 41 to the organic functional layer 42. The higher the applied operating voltage on the organic light-emitting component 107, the more holes can overcome the energy barrier and hence contribute to the flow of holes in the component 107.

At a low operating voltage, only a few holes arrive at the organic light-emitting layers 51, 52, 53 therefore, with a large proportion of the holes already recombining with electrons in the organic light-emitting layer 51 so that in the organic light-emitting layers 52, 53 the number of photons produced is lower than the number of photons produced in the organic light-emitting layer 51 owing to corresponding recombinations of holes and electrons. As a result, the emission intensity of the organic light-emitting layer 51 is greater than the emission intensity of the organic light-emitting layer 52, which is in turn greater than the emission intensity of the organic light-emitting layer 53. At a high operating voltage, on the other hand, more holes also arrive in the organic light-emitting layers 52 and 53 so that a higher emission intensity than in a low operating voltage can be achieved in these organic light-emitting layers relative to the emission intensity of the organic light-emitting layer 51. In an emission color combination as described previously, this results in a warm white color impression at low operating voltages and in a neutral white color impression at high operating voltages.

Additionally or alternatively, the organic functional layers 43 and 44 can produce a corresponding energy barrier for electrons on the electron-conducting side of the organic functional layer stack 4 too. FIG. 17 shows the energy levels of the organic functional layers 43 and 44. The materials of the layers 43 and 44 are electron-conducting and have a mobility for electrons that is greater than the corresponding mobility for holes. Analogously to the energy situation on the hole-conducting side, as described in conjunction with FIG. 16, there is, at the interface between the organic functional layers 43 and 44, an energy gap $\Delta E_{LUMO}$ between the two energy levels LUMO3 and LUMO4 that is likewise preferably at least 0.1 eV. During operation of an organic light-emitting component with such an energy barrier $\Delta E_{LUMO}$, electrons must overcome the energy barrier $\Delta E_{LUMO}$ when changing over from layer 44 to layer 43. The higher the operating voltage applied to the component 107, the more electrons can overcome the energy barrier and hence contribute to the flow of electrons in the component 107. In accordance with the previous description, a high operating voltage prompts a sufficient number of electrons to arrive in the organic light-emitting layers 51, 52, 53 so that a neutral white color is emitted in the corresponding combination of emission colors. At a lower operating voltage, fewer electrons arrive via the interface, which means that a reduced emission intensity from the organic light-emitting layers 51 and 52 is observed relative to the emission intensity of the organic light-emitting layer 53, resulting in a cold white emission color for the part.

On account of the voltage drop described in conjunction with the previous examples, which results in a luminous density gradient, the use of an organic functional layer stack 4 as described in conjunction with FIGS. 15 to 17 additionally allows the production of a color gradient, which can be varied like the luminous density gradient in accordance with the previously described methods.

In examples described in conjunction with the Figures of organic light-emitting components and methods of operation, the combination of the described geometries and operating parameters allows specific setting and also specific variation of luminous density gradients or of luminous density gradients and color gradients by virtue of a PWM mode. At the same time, regardless of the chosen gradient, it is possible to set the luminosity of the organic light-emitting component. It is thus possible to adjust different organic functional layer stacks with different characteristics in respect of the desired gradient to suit prescribed conditions. In addition, the gradients can be varied over time by modulating the PWM signal, which allows a vividness to be achieved for the luminous areas.

The description on the basis of the examples does not limit this disclosure thereto. Rather, our methods comprise any new feature and any combination of features, which particularly includes any combination of features in the appended claims, even if the feature or combination is itself not explicitly specified in the claims or examples.

This application claims priority of DE 10 2013 107 529.0, the disclosure of which is incorporated herein by reference.

The invention claimed is:

1. A method of operating an organic light-emitting component,
   wherein the organic light-emitting component has a first electrode and a second electrode that have arranged between them an organic functional layer stack having at least one organic light-emitting layer that, during operation, produces light emitted via a luminous area,
   wherein the first and second electrodes and the organic functional layer stack are in an extensive form,
   in contact with the first electrode, at each of two opposite edges of the first electrode a respective conductor track is arranged that extends in a longitudinal direction along the respective edge,
   the two conductor tracks have contact made with them on a same side of the first electrode by a connection element so that during operation there is a voltage drop in each conductor track in the longitudinal direction, which voltage drop brings about a luminous density gradient on the luminous area in a direction following the longitudinal direction,
   the organic light-emitting component has a characteristic $r=dV/dj$,
   where V denotes an operating voltage and j denotes an operating current density and $dV/dj$ is the mathematical derivative of the operating voltage with respect to the operating current density,
   an operating point $r=r_A$ is chosen such that it holds that:

$0.75 \leq U \leq 1$, with $U=1-(1-H)/(1+H)$, $H=\cos h^{-1}(L/\Lambda)$ and $\Lambda=(r/R)^{0.5}$, where d denotes a distance between the conductor tracks in a direction transverse to the longitudinal direction, $L=0.5 \times d$ and R is the sheet resistance of the first electrode.

2. The method according to claim 1, wherein the organic optoelectronic component is operated with an operating current density $j_A$ at the operating point $r=r_A$, and a luminosity of the luminous area is set by pulse width modulation of the operating current density $j_A$.

3. The method according to claim 1, wherein a first operating point $r=r_{A1}$ having a corresponding operating current density $j_{A1}$ and a second operating point $r=r_{A2}$ having a corresponding operating current density $j_{A2}$ are chosen, with $j_{A2}>j_{A1}$, wherein $0.75 \leq U \leq 1$ holds for each $r=r_{A1}$ and $r_{A2}$ and a luminous density gradient on the luminous area is varied by varying the operating current density j with $j_{A1} \leq j \leq j_{A2}$.

4. The method according to claim 3, wherein pulse width modulation keeps an average of the operating current density j over time at a constant value for $j_{A1} \leq j \leq j_{A2}$.

5. The method according to claim 1, wherein $r=r_A$ is chosen such that it holds that: $0.8 \leq U \leq 0.99$.

6. The method according to claim 1, wherein each of the two conductor tracks extends along the entire respective edge in the longitudinal direction over an edge region of the first electrode, and the conductor tracks have a sheet resistance of greater than or equal to 10 mΩ/sq and less than or equal to 1000 mΩ/sq.

7. The method according to claim 1, wherein the first electrode has a sheet resistance R with 1 Ω/sq≤R≤20 Ω/sq.

8. The method according to claim 1, wherein a sheet resistance R of the first electrode is greater by at least a factor of 50 than a sheet resistance of the second electrode (3).

9. The method according to claim 1, wherein the luminous area has a rectangular form or a free form derived from a rectangle.

10. The method according to claim 1, wherein the organic functional layer stack has at least two organic light-emitting layers that, during operation, emit light having different wavelengths, and at least two organic functional layers between an electrode and the organic light-emitting layers have an energy barrier for charge carriers in the direction of the organic functional layers.

11. A method of operating an organic light-emitting component,
   wherein the organic light-emitting component has a first electrode and a second electrode that have arranged between them an organic functional layer stack having at least one organic light-emitting layer that, during operation, emits light via a luminous area,
   wherein the first and second electrodes and the organic functional layer stack are in extensive form,
   the first electrode has contact made with it by at least one first connection element at an edge of the first electrode so that there is a voltage drop in the first electrode in a direction leading away from the at least one first connection element, which voltage drop brings about a luminous density gradient on the luminous area in the direction leading away from the at least one first connection element,
   the organic light-emitting component has a characteristic $r=dV/dj$,
   where V denotes an operating voltage and j denotes an operating current density, and $dV/dj$ is the mathematical derivative of the operating voltage with respect to the operating current density,
   an operating point $r=r_A$ is chosen such that it holds that:

$U \leq 0.2$, with $U=1-(1-H)/(1+H)$, $H=\cos h^{-1}(L/\Lambda)$ and $\Lambda=(r/R)^{0.5}$, where d denotes a width of the luminous area transversely to the edge of the first electrode having the at least one connection element, L=d and R is the sheet resistance of the first electrode.

12. The method according to claim 11, wherein the organic optoelectronic component is operated with an operating current density $j_A$ at the operating point $r=r_A$, and a luminosity of the luminous area is set by pulse width modulation of the operating current density $j_A$.

13. The method according to claim 11, wherein a first operating point $r=r_{A1}$ having a corresponding operating current density $j_{A1}$ is chosen, for which it holds that $U \geq 0.8$, and a second operating point $r=r_{A2}$ having a corresponding operating current density $j_{A2}$ is chosen, for which it holds that $U \leq 0.2$, and a variation in the operating current j that is present between the connection elements and the second electrode with $j_{A1} \leq j \leq j_{A2}$ produces a variation between a luminous density gradient on the luminous area at the second operating point $r_{A2}$ and no luminous density gradient on the luminous area at the first operating point $r_{A1}$.

14. The method according to claim 13, wherein pulse width modulation keeps an average of the operating current density over time at a constant value for each operating current density j with $j_{A1} \leq j \leq j_{A2}$.

15. The method according to claim 11, wherein a plurality of connection elements are arranged next to one another along the same edge of the first electrode.

16. The method according to claim 11, wherein at least one further connection element or a plurality of further connection elements is/are arranged at an edge of the first electrode opposite the edge having the at least one first connection element.

17. The method according to claim 11, wherein a plurality of connection elements are arranged at each of a plurality of edges of the first electrode.

18. The method according to claim 11, wherein the first electrode has a sheet resistance R with $1 \, \Omega/sq \leq R \leq 20 \, \Omega/sq$.

19. The method according to claim 11, wherein a sheet resistance R of the first electrode is greater by at least a factor of 50 than a sheet resistance of the second electrode (3).

20. The method according to claim 11, wherein the luminous area has a rectangular form or a free form derived from a rectangle.

21. The method according to claim 11, wherein the organic functional layer stack has at least two organic light-emitting layers that, during operation, emit light having different wavelengths, and at least two organic functional layers between an electrode and the organic light-emitting layers have an energy barrier for charge carriers in the direction of the organic functional layers.

* * * * *

UNITED STATES PATENT AND TRADEMARK OFFICE
CERTIFICATE OF CORRECTION

PATENT NO. : 9,655,198 B2
APPLICATION NO. : 14/905316
DATED : May 16, 2017
INVENTOR(S) : Krummacher et al.

Page 1 of 1

It is certified that error appears in the above-identified patent and that said Letters Patent is hereby corrected as shown below:

On the Title Page

At (73) Assignee: Please change "Oled" to -- OLED --.

In the Claims

In Column 20, at Line 26, please delete "(3)".

In Column 22, at Line 12, please delete "(3)".

Signed and Sealed this
Thirty-first Day of October, 2017

Joseph Matal
*Performing the Functions and Duties of the
Under Secretary of Commerce for Intellectual Property and
Director of the United States Patent and Trademark Office*